(12) United States Patent
Kanno et al.

(10) Patent No.: US 9,601,307 B2
(45) Date of Patent: Mar. 21, 2017

(54) CHARGED PARTICLE RADIATION APPARATUS

(71) Applicant: Hitachi High-Technologies Corporation, Minato-ku, Tokyo (JP)

(72) Inventors: Seiichiro Kanno, Tokyo (JP); Masashi Fujita, Tokyo (JP); Naoya Ishigaki, Tokyo (JP); Makoto Nishihara, Tokyo (JP); Kumiko Shimizu, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/764,641

(22) PCT Filed: Feb. 5, 2014

(86) PCT No.: PCT/JP2014/052613
§ 371 (c)(1),
(2) Date: Jul. 30, 2015

(87) PCT Pub. No.: WO2014/141775
PCT Pub. Date: Sep. 18, 2014

(65) Prior Publication Data
US 2015/0371814 A1 Dec. 24, 2015

(30) Foreign Application Priority Data
Mar. 15, 2013 (JP) .................................. 2013-052611

(51) Int. Cl.
*H01J 37/20* (2006.01)
*H01J 37/28* (2006.01)
(Continued)

(52) U.S. Cl.
CPC .............. *H01J 37/20* (2013.01); *H01J 37/28* (2013.01); *H01L 21/67248* (2013.01);
(Continued)

(58) Field of Classification Search
USPC ...... 250/440.11, 441.11, 442.11, 443.1, 306, 250/307, 309, 310, 311
See application file for complete search history.

(56) References Cited

U.S. PATENT DOCUMENTS 5,413,167 A * 5/1995 Hara ....................... G03F 7/707
165/104.33
7,763,863 B2 7/2010 Mizuochi et al.
(Continued)

FOREIGN PATENT DOCUMENTS

JP 6-36997 A 2/1994
JP 2000-91201 A 3/2000
(Continued)

OTHER PUBLICATIONS

International Search Report (PCT/ISA/210) dated Apr. 15, 2014 with English-language translation (four (4) pages).

*Primary Examiner* — Nicole Ippolito
(74) *Attorney, Agent, or Firm* — Crowell & Moring LLP

(57) ABSTRACT

The present invention provides a high-throughput scanning electron microscope in which a wafer (9) is held by an electrostatic chuck (10), an image is obtained using an electron beam, and the wafer surface is measured, wherein even in a case where the temperature of the wafer (9) is changed due to the environmental temperature the electron scanning microscope is capable of preventing any loss in resolution or the deterioration of the measurement reproducibility caused by thermal shrinkage accompanied by temperature change of the wafer (9). A drill hole is provided on the rear surface of the electrostatic chuck (10), and a thermometer (34) is secured in place so that the front end is brought into elastic contact with the bottom surface of the drill hole. The output of the thermometer (34) is sent to a computing unit, the computing unit computes a measurement limit time for beginning measurement, based on a
(Continued)

predetermined algorithm, from an output value of the thermometer (34), and measuring begins at individual measurement sites after the measurement limit time has elapsed.

5 Claims, 6 Drawing Sheets

(51) Int. Cl.
*H01L 21/67* (2006.01)
*H01L 21/683* (2006.01)

(52) U.S. Cl.
CPC .. *H01L 21/6831* (2013.01); *H01J 2237/2001* (2013.01); *H01J 2237/24585* (2013.01); *H01J 2237/24592* (2013.01); *H01J 2237/2817* (2013.01)

(56) References Cited

U.S. PATENT DOCUMENTS

| | | | |
|---|---|---|---|
| 2008/0236614 A1 | 10/2008 | Yakushiji et al. | |
| 2009/0256076 A1 | 10/2009 | Fukuda et al. | |
| 2012/0112068 A1* | 5/2012 | Maeda | G01N 23/2251 |
| | | | 250/310 |

FOREIGN PATENT DOCUMENTS

| | | | | |
|---|---|---|---|---|
| JP | 2002-164399 A | | 6/2002 | |
| JP | 2003-188075 A | | 7/2003 | |
| JP | 2004-172487 A | | 6/2004 | |
| JP | 2006-66690 A | | 3/2006 | |
| JP | 2008-311351 A | | 12/2008 | |
| JP | 2009-259444 A | | 11/2009 | |
| JP | WO 2011/004533 | * | 1/2011 | ........... G01N 23/225 |
| JP | 2013-8987 A | | 1/2013 | |

* cited by examiner

CHARGED PARTICLE RADIATION APPARATUS

TECHNICAL FIELD

The present invention relates to a charged particle radiation apparatus which performs line-width measurement, defect inspection or image acquisition for a semiconductor device using an electron beam or an ion beam. In particular, the present invention relates to a charged particle radiation apparatus which is provided with an electrostatic chuck mechanism for holding a specimen with electrostatic attraction.

BACKGROUND ART

In recent years, an electron microscope, which is one type of a charged particle radiation apparatus, is used in size measurement or defect inspection for a semiconductor device pattern. For example, a measuring SEM (critical-dimension scanning electron microscope, hereinafter "CD-SEM") is used for measuring the gate dimension of a semiconductor device, and a defect inspection SEM is used for inspecting a defect. Moreover, a scanning electron microscope is also used in the conduction inspection of a deep hole for wiring using the potential contrast. Furthermore, there is a focused ion beam apparatus which processes and observes a semiconductor device using an ion beam.

When a temperature difference exists between a beam irradiation subject by the charged particle radiation apparatus and a specimen stage for mounting the beam irradiation subject, the specimen is thermally deformed.

PTL 1 discloses that temperature of an electrostatic chuck, i.e. a wafer stage is measured using the thermal expansion due to temperature, by chronologically measuring pattern distance between two points on a dummy specimen, and this measured temperature data is used in confirmation or calibration of beam drift, etc.

CITATION LIST

Patent Literature

PTL 1: JP Patent Publication (Kokai) 2008-311351 A (corresponding to U.S. Pat. No. 7,763,863)

SUMMARY OF INVENTION

Technical Problem

The thermal deformation stated as above occurs at a time when the specimen is mounted on the electrostatic chuck. When the temperature difference between the specimen and the electrostatic chuck is eliminated, the thermal deformation is also eliminated. Therefore, it is desirable to start a measurement after waiting until the thermal deformation of the specimen is eliminated in order to perform the measurement using the charged particle beam in the absence of thermal deformation. Meanwhile, high-throughput is required for an apparatus for measuring or inspecting a semiconductor device, represented by the CD-SEM. In the apparatus expected to have high-throughput, standby time can be a cause of reducing throughput. That is, when thermal deformation is absent, high-throughput and highly-accurate measurement are in a trade-off relationship. PTL 1 describes that the beam drift and the like are confirmed using the temperature data, but fails to disclose how to implement the highly-accurate measurement and the high-throughput at the same time. When the semiconductor wafer is introduced into the CD-SEM, the temperature of the semiconductor wafer varies depending on the difference in the environment where the semiconductor wafer is put in before being introduced. As described in PTL 1, it is impossible to adapt to thermal deformation, which may be variously changed, by merely measuring the dummy wafer.

Hereinafter, a charged particle radiation apparatus, an object of which is to achieve both high-throughput and high accuracy in the measurement or inspection, will be described.

Solution to Problem

According to an aspect for achieving the object, there is provided a charged particle radiation apparatus which is provided with an electrostatic chuck for holding a specimen, the apparatus including a thermometer which measures the temperature of the electrostatic chuck; and a control device which controls the charged particle radiation apparatus to perform a measurement or an inspection using a charged particle beam, based on relation information between temperature information obtained by the thermometer and a measuring result by the charged particle beam, or an inspection onset time, or a standby time. According to such configuration, it is possible to achieve both the high-throughput and highly-accurate measurement at high level since the measurement or inspection can be started at a proper time according to a temperature condition of the specimen.

According to another aspect for achieving the object, there is provided a charged particle radiation apparatus which is provided with an electrostatic chuck for holding a specimen, the apparatus including: a thermometer which measures the temperature of the electrostatic chuck, wherein the electrostatic chuck is formed with a counter bore having a proximity surface relatively closer to a specimen attracting plane of the electrostatic chuck with respect to a plane opposite to the specimen attracting plane of the electrostatic chuck; and the thermometer is supported by a pressing member for pressing the thermometer into the proximity surface of the counter bore. According to such configuration, it is possible to correctly identify the thermal deformation depending on the temperature of the specimen since the temperature of the specimen can be measured with high accuracy in a state in which there is no potential fluctuation caused by bringing the thermometer into direct contact with the specimen. Consequently, it is able to achieve both high-throughput and high accuracy in the measurement or inspection.

Advantageous Effects of Invention

According to these configurations, it is possible to provide a charged particle radiation apparatus an object of which is to achieve both high-throughput and high accuracy in the measurement or inspection.

DESCRIPTION OF EMBODIMENTS

Figure 1:
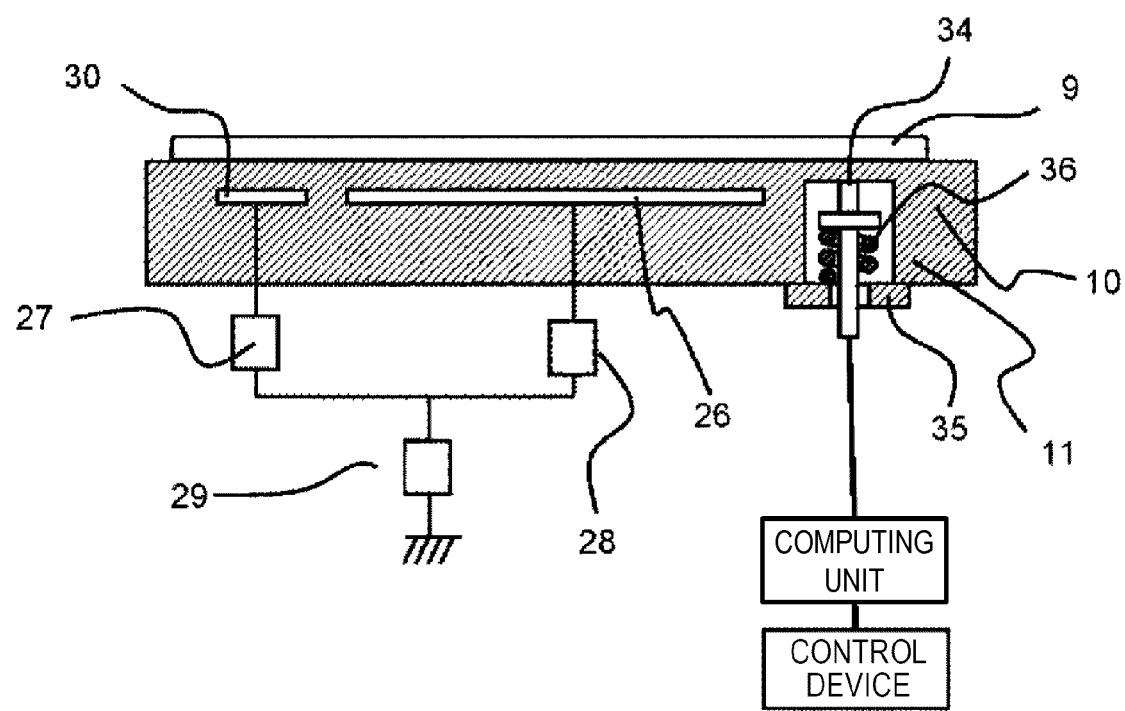
FIG. 1 is a diagram showing an example of an electrostatic chuck mechanism with a thermometer.

A charged particle radiation apparatus with an electrostatic chuck will be described below. A basic principle of the measurement will be simply explained with the CD-SEM taken as an example. CD-SEM is one type of a scanning electron microscope, which is equipped with a function for measuring such as line-width of a pattern in a semiconductor device. Primary electrons are emitted from an electron gun and accelerated by applying a voltage thereto. The beam diameter of the electron beam is narrowed by an electromagnetic lens. A specimen such as a semiconductor wafer is two-dimensionally scanned with the electron beam. Secondary electrons generated by incidence of the scanned electron beam into the specimen are detected using a detector. The intensity of the secondary electrons reflects a surface profile of the specimen, and thus a fine pattern on the specimen can be imaged by synchronizing scanning of the electron beam and detection of the secondary electrons and by displaying such result on a monitor. When the CD-SEM measures, for example, a line-width of a gate electrode, a dimension is derived by determining edges of the pattern based on the change in the brightness of the obtained image. This is the measurement principle of the CD-SEM.

Since the CD-SEM is used for dimension measurement of the device pattern in a semiconductor manufacturing line, the throughput is very important as well as the performance of the electron microscope such as resolution and length measurement reproducibility. One of the factors which adversely affect the resolution and the length measurement reproducibility is the image drift caused by the thermal shrinkage of the wafer. That is, even though the environment of the clean room in which CD-SEM is typically installed is managed including the temperature, the temperature varies by about ±1-2° C. The temperature of the wafer also varies by around ±1° C. since it is exposed to fluctuation in environmental temperature. Thus, the temperature cannot be a constant value.

Consequently, when the temperature difference occurs between the stages for fixing the wafer, heat transfer occurs between the wafer and the stages and the wafer temperature is changed, thereby causing thermal shrinkage. The thermal shrinkage continues until the wafer has the temperature identical to the stage temperature. The amount of thermal shrinkage especially becomes larger as getting closer to an outer periphery of the wafer. If the SEM image is imaged when the thermal shrinkage occurs, clear image cannot be acquired since the image drift is generated during the imaging. Thus the resolution and the length measurement reproducibility are deteriorated. The larger the number of frames is, the longer the time required for image is. Therefore, there is a possibility that the highly-accurate measurement is difficult to achieve. As stated above, the image drift does not occur after the heat transfer between the wafer and the stages is finished. It is possible to suspend initiation of acquisition of SEM image until the heat transfer is sufficiently completed. However, it can be a factor of decrease in throughput when the inspection apparatus such as the CD-SEM is used.

As stated above, setting a proper minimum standby time until the SEM image is acquired is an extremely important task since the image drift due to the heat transfer between the wafer and the stage may cause problems such as deteriorated resolution, degraded length measurement reproducibility and reduced throughput.

In the wafer, which is a measurement subject of the CD-SEM, the temperature varies depending on a type of semiconductor manufacturing process or a standby time before introducing into the CD-SEM. To accommodate this temperature fluctuation, it is necessary to measure the temperature of the wafer itself the length of which will be measured at first. That is, means or a method is demanded for directly measuring the wafer temperature which varies due to the influence of the environmental temperature, e.g. that of the clean room, and means is demanded for setting length measurement onset limit time for each wafer based on the acquired wafer temperature data.

The following example is intended to satisfy these requirements, and will describe the scanning electron microscope for fixing the wafer with the electrostatic chuck and acquiring the SEM image to be measured, which is able to measure the temperature of the electrostatic chuck for each wafer to be measured and to set the proper measurement onset time for each wafer based on this temperature data.

Moreover, another example will describe the scanning electron microscope for fixing the wafer with the electrostatic chuck and acquiring the SEM image to be measured, which is able to measure the temperature of the electrostatic chuck for each wafer to be measured, to estimate a long-term environmental temperature trend based on this temperature data and to automatically adjust the setting temperature of the temperature controller mounted to the scanning electron microscope.

More specifically, the examples will describe the scanning electron microscope for holding the wafer with the electrostatic chuck and for acquiring and measuring the SEM image with the electron beam, which is able to measure the temperature of the electrostatic chuck for each wafer to be measured, to calculate the proper measurement onset limit time, not influencing the measurement, with a predetermined algorithm based on this temperature data, and to determine the measurement onset time base on this calculation result.

Furthermore, the examples will describe the scanning electron microscope for holding the wafer with the electrostatic chuck and for acquiring and measuring the SEM image with the electron beam, which is able to measure the temperature of the electrostatic chuck for each wafer to be measured, to acquire the long-term environmental temperature trend based on this temperature data, to calculate the proper setting temperature of the temperature controller mounted to the scanning electron microscope based on the trend, and to automatically adjust the setting temperature based on this calculation result.

According to the configuration stated above, it is possible to provide the scanning electron microscope acquiring and measuring the SEM image with the electron beam, which has no problems such as deteriorated resolution and degraded length measurement reproducibility but offers high-throughput since the measurement starts after elapsing the proper minimum measurement onset limit time not to cause the image drift for each wafer to be measured.

Moreover, according to another configuration stated above, it is possible to provide the scanning electron microscope with higher reliability, since the long-tem environmental temperature trend can be measured for each wafer to be measured based on the temperature data of the electrostatic chuck and the proper setting temperature of the temperature controller mounted to the scanning electron microscope can be automatically adjusted based on this trend.

Hereinafter, the specific configuration of the scanning electron microscope will be explained with reference to drawings.

Figure 3:
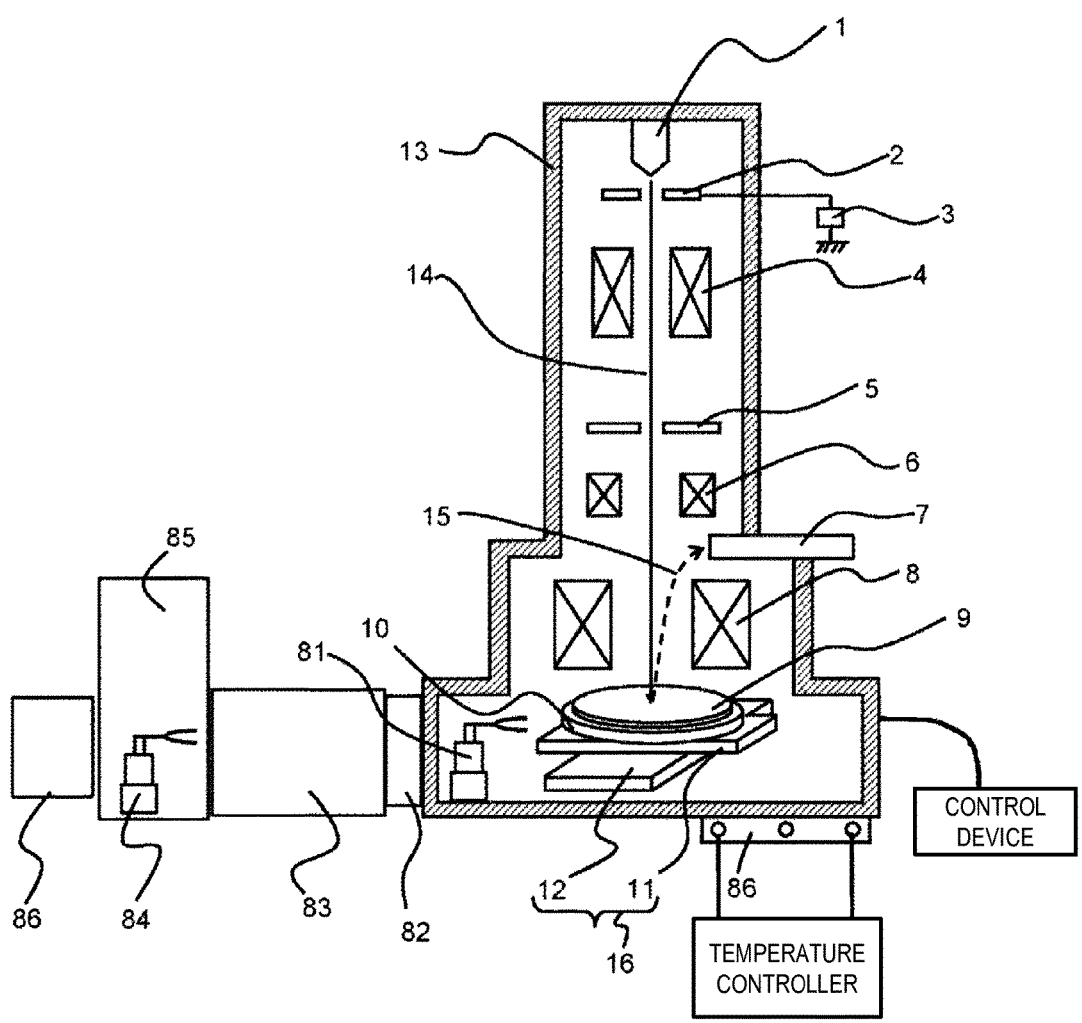
FIG. 3 is a diagram showing an example of a scanning electron microscope.

First, an outline of the CD-SEM will be described using FIG. 3. The electrons, emitted from an electron source 1 held within a housing 13 kept at high vacuum ($10^{-6}$ Pa or less), are accelerated by a primary electron accelerating electrode 2 to which the high voltage is applied by a high-voltage power supply 3. The electron beam 14 is converged by an electron lens 4 for converging. After the beam current amount of the electron beam is adjusted by an aperture 5, the electron beam is deflected by a scanning coil 6 and the wafer is two-dimensionally scanned with such electron beam. The electron beam is focused by narrowing by an electronic objective lens 8 disposed immediately above a semiconductor wafer (hereinafter, simply "wafer") 9, which is the specimen, thereby being incident onto the wafer.

Secondary electrons 15, generated by the incidence of the primary electrons, are detected by a secondary electron detector 7. The amount of the detected secondary electrons reflects a surface profile of the specimen, and thus the surface profile can be imaged based on information on the secondary electrons. The wafer 9 is held while ensuring a certain degree of flatness on the electrostatic chuck 10, and secured on an X-Y stage 16. Moreover, in FIG. 3, the housing and its internal structure are shown as a sectional drawing viewed from a horizontal direction, while the X-Y stage, the electrostatic chuck and the wafer are shown as a perspective view in order to easily picture the motions. The electrostatic chuck is stacked on a Y stage 11 of the X-Y stage and movable in a Y direction. The Y stage is stacked on an X stage 12 and movable in an X direction. Thus the wafer is freely operable in either X direction or Y direction, whereby an arbitrary position within the wafer plane can be measured.

Although not shown, a wafer transfer lift mechanism which is operable in upper and lower directions for attaching and detaching the wafer to and from the electrostatic chuck is provided. This mechanism is capable of delivering and receiving the wafer to and from a load chamber 83 by cooperative operation with a transfer robot 81.

When the wafer to be measured is transferred to the electrostatic chuck, firstly, the wafer set in a wafer cassette 86 is carried into the load chamber 83 by a transfer robot 84 of a mini-environment 85. It is possible to evacuate or release the atmosphere from the load chamber using a vacuum evacuation system (not shown). The wafer is transferred onto the electrostatic chuck while the vacuum degree within the housing 13 is kept at a level without a practical problem by opening and closing a valve 82 and by the movement of the transfer robot 81.

The temperature of the apparatus is kept at a constant level by recycling a cooling fluid within a heat sink 86 mounted to a lower surface of the housing 13. The temperature of such cooling fluid is adjusted by a temperature controller 87. A heat source of the apparatus may include an electronic optical system, an evacuation system, various types of sensor, a stage driving system and the like. The temperature of the electrostatic chuck is determined depending on a heat balance between these heat sources and the heat removal using the heat sink. Therefore, to suppressing the image drift, which is the technical problem to be solved by the invention, the temperature of the temperature controller is set such that the temperature of the carried wafer is approximately identical to that of the electrostatic chuck.

Figure 4:
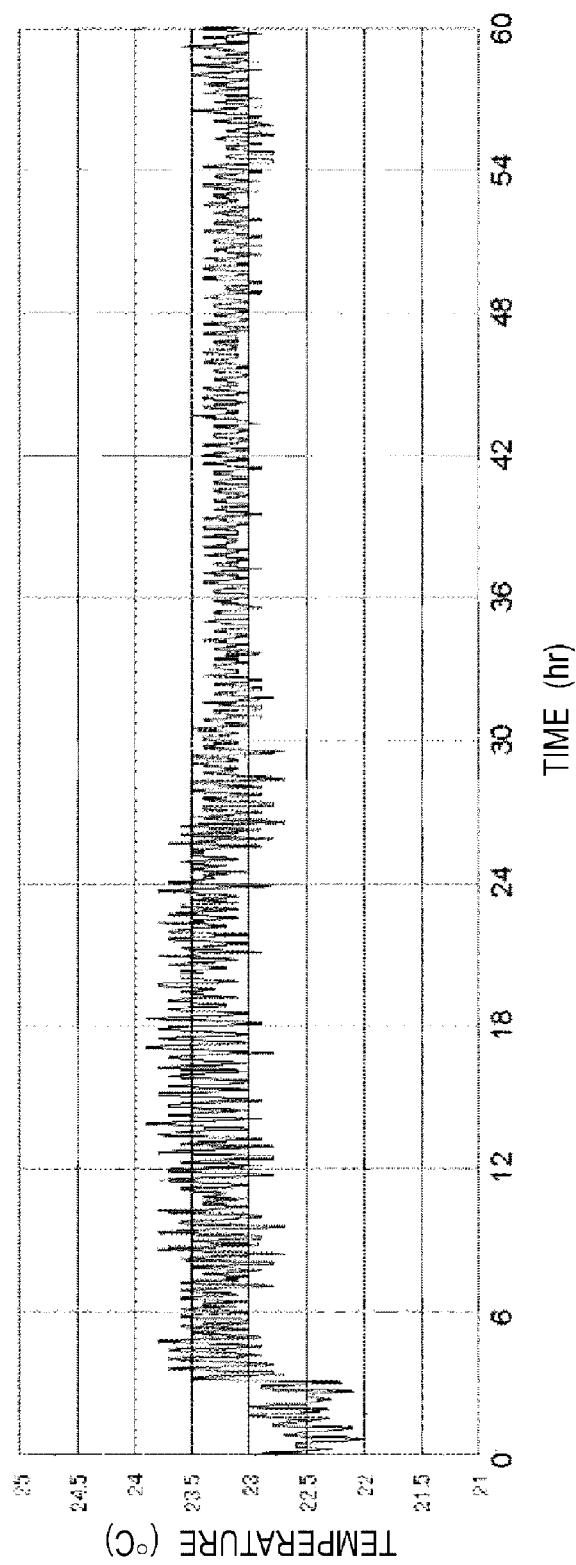
FIG. 4 is a diagram showing a result obtained by measuring the temperature of a clean room.

However, the wafer temperature constantly fluctuates due to the influence of the temperature of the environment in which the apparatus is installed. For example, the temperature of the clean room, in which the apparatus is typically installed, typically fluctuates by about ±1° C. This fluctuation range can be changed in the long term depending on the number of workers entering the clean room, the ambient temperature and status of other apparatuses arranged all around. FIG. 4 shows an example of measurement of the environmental temperature. From this result, it is understood that the temperature of the clean room does not fluctuate only periodically in several hours, but the average temperature changes depending on a period of the time.

Therefore, it is rare that the carried wafer and the electrostatic chuck have the completely same temperature; in an actual case, slight temperature difference typically occurs therebetween. When the wafer is held by the electrostatic chuck, the heat transfer occurs such that these temperatures converge to the same temperature finally. During this time, the wafer temperature changes and the wafer is thermally shrunk. If such temperature difference is small enough, or if the sufficient time has elapsed after the wafer is held by the electrostatic chuck, the measurement is not affected. However, when such temperature difference is large, or the standby time is short until the measurement is started, the influence of the image drift is non-negligible, thereby causing the deteriorated resolution and degraded length measurement reproducibility. Moreover, when the image is acquired by the SEM, the number of frames and the screen dimensions are generally modified depending on the desired image conditions, in order to obtain the image having a quality suited to the purpose, and therefore the imaging time varies. Therefore, influence of the image drift can also be changed depending on the imaging time. Moreover, since the wafer temperature fluctuates according to the environment, the proper measurement onset limit time must be set for each wafer to acquire the maximum throughput.

A first example will be explained with reference to FIGS. 1 and 2. The present example shows an exemplary method for controlling the charged particle radiation apparatus so as to perform measurement or inspection using the charged particle beam, based on relationship information between the temperature information and measuring result by the charged particle beam, or an inspection onset time. Moreover, the present example shows an exemplary configuration in which a counter bore having a proximity surface relatively closer to a specimen attracting plane of the electrostatic chuck with respect to a plane opposite to the specimen attracting plane of the electrostatic chuck is provided in the electrostatic chuck; and the thermometer is supported by the pressing member for pressing the thermometer to the proximity surface of the counter bore.

FIG. 1 is a diagram showing sectional views of the electrostatic chuck and the thermometer. The electrostatic chuck 10 is a so-called two-pole electrostatic chuck, which has two internal electrodes including a circular internal electrode 26 and a ring-shaped internal electrode 30 within an alumina sintered ceramics. Direct current power supplies 27 and 28 which operate the electrostatic chuck are connected to these internal electrodes while overlapping a retarding power supply 29 in a floating state. Therefore, it is possible to electrostatically attract the wafer 9 with a potential difference between the internal electrodes given by the direct current power supplies 27 and 28. The retarding power supply 29 is used to decelerate the electron beam, narrowed by accelerating with the high acceleration voltage, in order to improve the resolution, immediately before the electron beam enters the wafer, so as not to damage the device on the wafer.

The drill hole having a diameter of 10 mm is provided at one location on a rear surface of the electrostatic chuck 10. A thermometer 34 is inserted such that a tip of the thermometer contacts with a bottom surface (proximity surface) of the drill hole. The thermometer is provided with a flange portion, the tip of which elastically contacts by a coil spring 36 and a restraining flange 35, using the flange portion. Consequently, the reproducibility of the contact state between the thermometer and the electrostatic chuck is ensured.

When the wafers are stacked on and held by the electrostatic chuck and there is a temperature difference between the wafers and the electrostatic chuck, heat transfer occurs and the chuck temperature varies. By measuring this with the thermometer, it is possible to estimate the wafer temperature without bringing the thermometer into contact with the rear surface of the wafer. The data is sent from the thermometer to a computing unit, which calculates the measurement onset limit time depending on measuring conditions including but not limited to the number of frames and measuring coordinates. The calculated result is input to the control device. The control device set the proper standby time for each continuous location based on this result and performs the measurement.

In the present example, the first reason why the thermometer does not directly contact with the wafer is to prevent the foreign matters from increasing on the rear surface of the wafer. The increased foreign matters on the rear surface may cause the problem since they may drop on a surface of the lower wafer within the wafer cassette or may contaminate the next stage of the process device. The second reason is to stabilize the wafer potential. That is, since the wafer has the relatively high potential of the retarding voltage, the wafer potential may be changed when the thermometer contacts with the wafer. The third reason is to protect the thermometer from inclusion of noise.

Thus the wafer temperature is estimated by measuring the temperature of the electrostatic chuck, instead of the wafer. The wafer has a thickness of 0.775 mm according to the standard when the diameter is 300 mm, which is thinner than several millimeters, the normal thickness of the electrostatic chuck. Thus the heat capacity is small, i.e., a fraction. Therefore, the temperature fluctuation of the electrostatic chuck is caused by the heat transfer with the wafer, which has the temperature fluctuation of about ±1° C. due to influence of the environmental temperature, and is a fraction of that of the wafer. When monitoring takes a long time since the temperature fluctuation of the chuck is too small even though the temperature difference between the wafer and the electrostatic chuck is relatively small and the measurement limit time is short, the unnecessary standby time is incurred and the throughput may be rather worsened. For avoiding this problem, the temperature measurement must be performed correctly in a short time. It is necessary to measure the temperature at a point closer to the wafer as much as the possible. Thus the present example supposes the configuration in which the drill hole is provided on the rear surface of the electrostatic chuck. The thickness of this part is appropriately about 1 mm to 3 mm considering the manufacturing limitations. Moreover, the responsiveness is one of the most importance performances of the thermometer, thus the thermometer is desired to be a thermocouple thermometer or a temperature-measuring resistive element-type thermometer.

When the wafer temperature is measured with the configuration stated above, the important factor is the heat transfer reproducibility between the wafer and the electrostatic chuck. Since the heat transfer relies on an attracting force of the wafer, attracting force reproducibility is a main key for implementing the measurement with excellent reproducibility. The typical electrostatic chuck includes a Coulombic-type electrostatic chuck in which Coulomb force of polarization charge generates the attracting force almost without the leakage current, and a Johson-Rahbeck type electrostatic chuck in which the electrostatic force is generated by flowing the leakage current. Considering the attracting force reproducibility, it is desired to use the Coulombic-type chuck in which the attracting force is not easily influenced by the rear layer or the warp of the wafer and an intrinsic resistivity is $10^{14}$ Ωcm or more. However, it is not limited to the Coulombic-type chuck considering the material of the wafer to be measured or a case when the only wafers having the same state of the layer formed on the rear surface are measured.

Similarly, the reproducibility of the contact state between the electrostatic chuck and the thermometer is also important. In the present example, an exemplary pressing member has a configuration in which a coli spring elastically presses the thermometer in order to maintain the pressing force at the constant level. However, the pressing member may be, for example, coated with grease in order to improve the heat transfer toward the tip of the thermometer.

Figure 2:
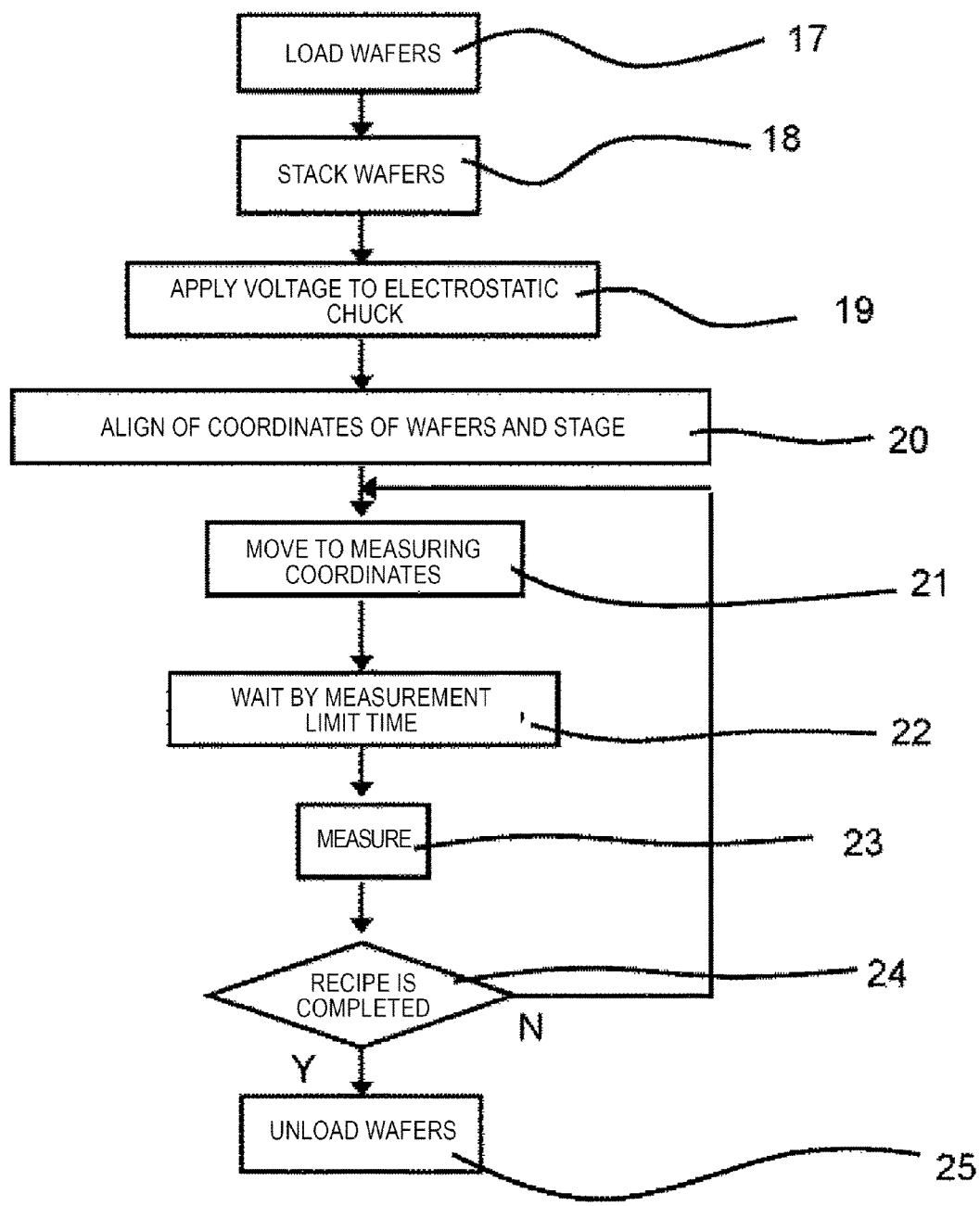
FIG. 2 is a flowchart illustrating a measurement process of a specimen using a charged particle radiation apparatus.

FIG. 2 shows a flowchart when the wafer is measured according to the present example. First, the wafer to be measured is loaded into a specimen chamber with a transport mechanism (17), and stacked onto the electrostatic chuck (18). Next, the voltage is applied to the chuck using the electrostatic chuck power supply to electrostatically attract the wafer (19). The applied voltage is typically about ±500 V to ±2000 V for the Coulombic-type electrostatic chuck. After alignment corrections of the coordinates within the wafer plane and the X-Y stage are performed (20), the stage is moved to the initial measuring location (21). During this time, the temperature of the electrostatic chuck is monitored periodically, and temperature data obtained from a point immediately before applying the voltage to a point after elapsing several seconds from the electrostatic attraction is sent to the computing unit. Such data is not only stored but used to calculate the wafer temperature, i.e. wafer's amount of thermal shrinkage based on the predetermined algorithm. The image drift amount within the measuring coordinates can be calculated from obtained thermal shrinkage amount. Conversely, it is possible to acquire the measurement onset limit time required for no influence on the resolution and the reproducibility of the measurement from the image drift amount.

It is preferable that these calculations are finished before the stage is completely moved to the initial measuring location. Next, the standby time is set based on the measurement onset limit time acquired in advance (22), and then the measurement is started (23). These processes are repeated until the recipe is finished (24), and the wafer is unloaded when all of the measurements are completed (25).

It is also possible to, for example, store as associated information a table showing the relationship between the temperature information on the electrostatic chuck (wafer's temperature information indirectly measured by the thermometer) and the measurement or inspection onset time (or standby time), or an arithmetic equation including these parameters as members, in a storage medium of the computing device or a storage medium accessible via a network.

The measurement onset time may be set by the control device on the basis of such table or equation. Moreover, the temperature fluctuation data during several seconds after the electrostatic attraction may be stored in relation to the measurement onset time corresponding to such temperature fluctuation data. If it is possible to identify the measurement onset time with high reproducibility even by calculating the measurement time with the wafer temperature measurement upon the attraction, a single temperature measurement result may be stored in related to the measurement onset time.

Furthermore, the standby time may be calculated by storing a standby time by which the image drift amount due to the thermal deformation is equal to or less than the predetermined value in relation to the temperature information and by arbitrarily setting the allowable drift amount.

The thermal deformation of a circular wafer may occur radially from the center of the wafer. In this case, almost no drift is generated at the center of the wafer, but the larger drift is generated as getting closer to the edges of the wafer. In this case, the standby time may be set depending on the measuring coordinates on the wafer according to the predetermined measurement sequence. For example, in the vicinity of the wafer center, the measurement may be started without the standby time regardless of the wafer temperature. In the other locations, the measurement may be performed after the calculated standby time has elapsed. When the wafer edges are measured after the center is measured, the sufficient standby time may not be passed. In this case, the time obtained by the calculation (the calculated standby time—the time to measure the wafer center) may be set as the standby time after the wafer center measurement, and the measurement for the wafer edges may be performed after this standby time has elapsed.

Furthermore, the standby time may be acquired based on the relationship between the temperature and the standby time in response to a distance from the wafer center or wafer coordinates.

According to the first example with this configuration, it is possible to estimate the wafer temperature with excellent reproducibility but without bringing the thermometer into direct contact with the rear surface of the wafer. If the proper minimum measurement onset limit time is set for each measuring point based on the temperature data, it is possible to provide the scanning electron microscope which has advantageously high-throughput, high resolution and excellent measurement reproducibility, but prevents the foreign matters from increasing on the rear surface and contaminations.

Figure 5:
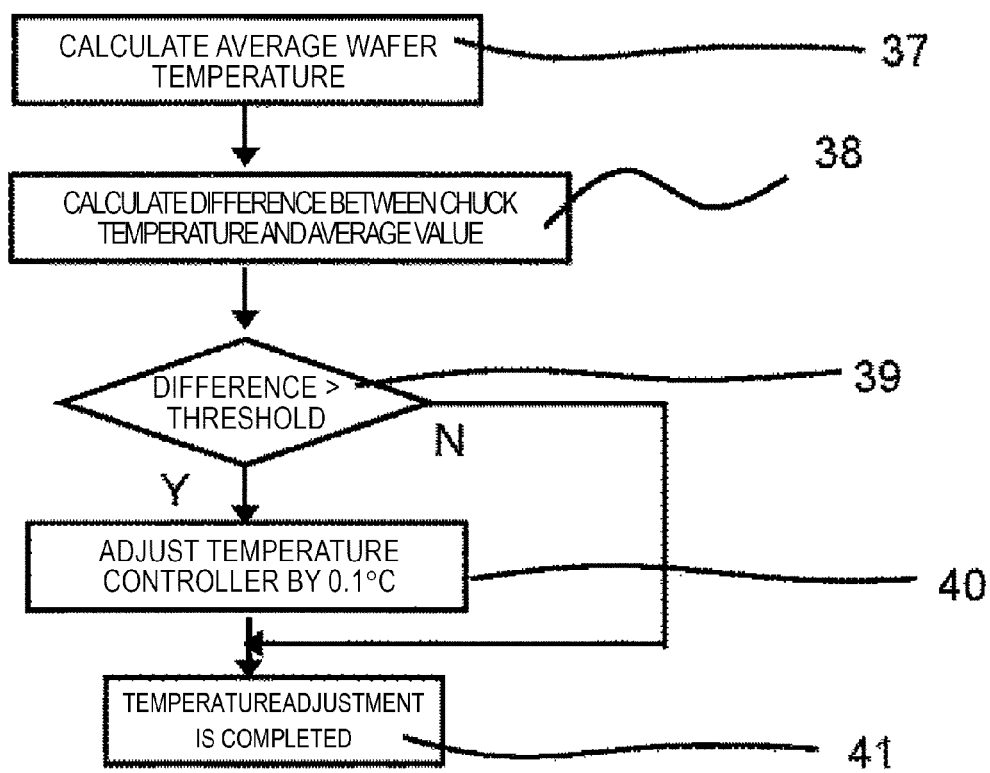
FIG. 5 is a flowchart illustrating a process of controlling a temperature controller based on the temperature of the specimen.
Figure 6:
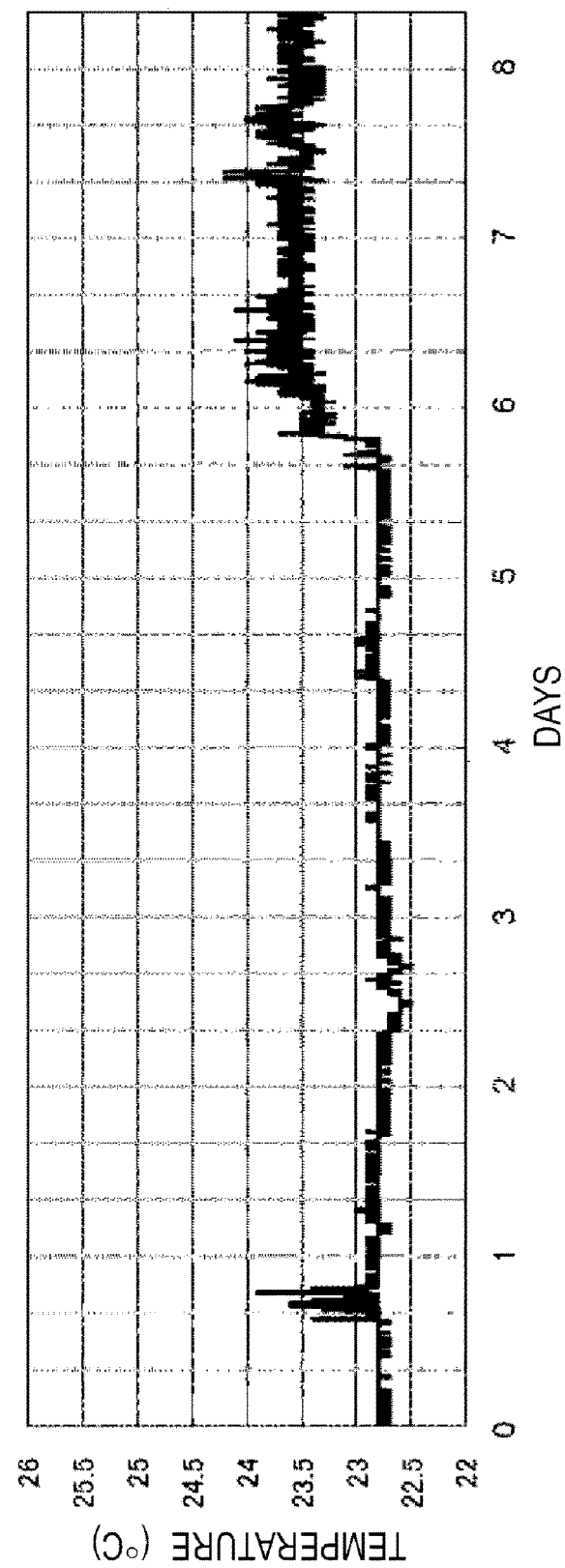
FIG. 6 is a diagram showing a result obtained by measuring the temperature of a clean room.

A second example will be explained with reference to FIGS. 5 and 6. FIG. 6 shows an example of monitoring result of the temperature fluctuation for 8 days in the vicinity of the scanning electron microscope installed within the clean room. From this result, it is found that the temperature fluctuation (first day), which may be caused by the works performed around, and the average temperature fluctuation (after 5th day), which may be mainly influenced by heat generation from other manufacturing apparatus installed around, occur even for only 1 week.

When the environmental temperature is changed in this way, the temperature difference between the electrostatic chuck and the wafer can occur because the temperature of the entering wafers are changed due to influence, even if the setting temperature of the temperature controller was set property at the time the apparatus was initially installed. Even though the temperature difference is generated, the proper measurement limit time is automatically set in response to the temperature difference between the electrostatic chuck and the wafer, using the scanning electron microscope employing the first example according to the invention. Thus there is no problem in the resolution or reproducibility. However, under a state in which the temperature difference occurs between the wafer to be measured and the electrostatic chuck, the throughput is reduced because the measurement limit time always becomes longer.

The second example is intended to solve this problem and to suppress the influence of the environmental temperature which fluctuates during relatively long period. FIG. 5 is a flowchart. First, the average value of the wafer temperature measured on the day is calculated once a day (37). The average temperature is compared with the average temperature of the previous day (38). If the environmental temperature does not fluctuate, the comparison result is basically almost 0° C. But if the environmental temperature fluctuates, the change, for example, rising by 0.33° C. can be confirmed. To eliminate this temperature difference, the setting temperature of the temperature controller may be changed so as to raise the temperature of the electrostatic chuck by a value corresponding to this difference. However, in practice, it is unclear whether the environmental temperature of the next day is shifted in the same way or not. Moreover, the scanning electron microscope such as CD-SEM is relatively bigger and has a larger heat capacity, thus it is difficult to adjust the temperature of the electrostatic chuck with excellent responsiveness. The temperature time constant is typically estimated to be from about 4 hours to 12 hours.

If the setting temperature of the temperature controller is changed by a value equivalent to 0.33° C. because the temperature difference of 0.33° C. occurs, the setting temperature may be resulted to fall 0.15° C. conversely in the next day. Under this kind of situation, the apparatus has poor temperature stability. Thus, for example, a threshold of the temperature difference (for example, 0.20° C.) may be determined in advance. When the temperature difference is higher than this threshold (39), the temperature may be adjusted by the predetermined change amount (for example, 0.10° C.) (40). When the temperature difference does not exceed the threshold, the process is completed without adjusting the temperature of the temperature controller (41). It is possible to adjust the temperature without damaging the stability of the apparatus temperature by managing the temperature of the temperature controller based on such algorithm.

For example, an exemplary case is assumed in which the setting temperature of the temperature controller is set to 20.0° C. and the temperature is changed by 0.33° C. due to the environmental changes. In this case, the temperature difference is higher than 0.20° C. Thus the temperature of the temperature controller is automatically adjusted to 20.1° C. In the next day, if the environmental temperature remains changed, the average temperature difference is about 0.23° C. Thus the setting temperature is also changed in the next day, and the temperature of the temperature controller is automatically adjusted to 20.2° C. In the day following the next day, the temperature difference is 0.13° C., thus no adjustment is required.

If the temperature setting of the temperature controller is adjusted according to this configuration, it is able to eliminate the possibility of over-correction due to too many changes in the temperature of the temperature controller even when the clean room is unexpectedly altered by, for example, construction and returned in the next day.

Therefore, it is possible to measure while automatically adjusting the temperature in the long term using the scanning electron microscope employing the second example even when the environmental temperature of the clean room is altered in the long run. Thus it is possible to provide the scanning electron microscope with stabilized resolution and reproducibility, high-throughput and excellent temperature stability over the long term. In the present example, the average temperature of the wafers is used as a barometer for estimating the environmental temperature fluctuation, but the temperature of the electrostatic chuck may be used since it reflects the wafer's temperature fluctuation. The present example adopts the thermometer having the configuration according to the first example, but if the operation is limited to the second example, the responsiveness of the chuck temperature can be slower than that of the first example. Thus there is no need to elastically mount the chuck to the drill hole.

REFERENCE SIGNS LIST

1: electron source
2: primary electron accelerating electrode
3: high-voltage power supply
4: electron lens
5: aperture
6: scanning coil
7: secondary electron detector
8: electron objective lens
9: wafer
10: electrostatic chuck
11: Y stage
12: X stage
13: housing
14: electron beam
15: secondary electron
16: X-Y stage
17, 18, 19, 20, 21, 22, 23, 24, 25, 26: circular internal electrode
27: direct current power supply
28: direct current power supply
29: retarding power supply
30: ring-shaped internal electrode
34: thermometer
35: restraining flange
36: coil spring
37, 38, 39, 40, 41, 81: transfer robot
82: valve
83: load chamber
84: transfer robot
85: mini-environment
86: wafer cassette

The invention claimed is:

1. A charged particle radiation apparatus which is provided with an electrostatic chuck for holding a specimen, the apparatus comprising:
    a thermometer which measures the temperature of the electrostatic chuck; and
    a control device which controls the charged particle radiation apparatus to perform a measurement or an inspection using a charged particle beam after a waiting time depending on temperature information obtained by the thermometer,
    wherein the control device performs the measurement or the inspection using the charged particle beam after the waiting time configured for each of a plurality of measurement points or for each of a plurality of inspection points.

2. The charged particle radiation apparatus according to claim 1, wherein
    the electrostatic chuck is a Coulombic-type electrostatic chuck in which an intrinsic resistivity of a dielectric is $10^{14}$ Ωcm or more.

3. The charged particle radiation apparatus according to claim 1,
    wherein the electrostatic chuck is formed with a counter bore having a proximity surface relatively closer to a specimen attracting plane of the electrostatic chuck with respect to a plane opposite to the specimen attracting plane of the electrostatic chuck,
    and wherein the proximity surface is provided with a pressing member for pressing the thermometer.

4. The charged particle radiation apparatus according to claim 3, wherein
    the pressing member has a spring which presses the thermometer into the proximity surface with a spring force.

5. A charged particle radiation apparatus which holds a specimen by an electrostatic chuck, acquires an image using an electron beam and measures a surface of the specimen, the apparatus comprising:
    a temperature controller for cooling; and
    a thermometer which is capable of measuring the temperature of the electrostatic chuck,
    wherein
    an output of the thermometer is sent to a computing unit to calculate an average temperature of the specimen during a predetermined period from the output value of the thermometer based on a predetermined algorithm by the computing unit, and a set temperature of the temperature controller is adjusted so that a temperature variation is given which is smaller than a difference between the calculated average temperature and an average temperature before the predetermined period.

* * * * *